United States Patent [19]
Chia et al.

[11] Patent Number: 5,927,505
[45] Date of Patent: Jul. 27, 1999

[54] OVERMOLDED PACKAGE BODY ON A SUBSTRATE

[75] Inventors: Chok J. Chia, Cupertino; Seng-Sooi Lim, San Jose; Maniam Alagaratnam, Cupertino, all of Calif.

[73] Assignee: LSI Logic Corporation, Milpitas, Calif.

[21] Appl. No.: 08/920,430

[22] Filed: Aug. 29, 1997

Related U.S. Application Data

[62] Division of application No. 08/506,164, Jul. 24, 1995, Pat. No. 5,744,084.

[51] Int. Cl.$^6$ .............................. B65D 73/02; H01L 23/04
[52] U.S. Cl. .......................... 206/710; 174/67; 206/465; 206/467; 206/509; 206/707; 257/730; 257/732
[58] Field of Search .................................... 206/465, 467, 206/509, 701; 174/67; 257/730, 732

[56] References Cited

U.S. PATENT DOCUMENTS

| | | | |
|---|---|---|---|
| 4,907,065 | 3/1990 | Sahakian | 257/730 |
| 5,231,425 | 7/1993 | Masuda et al. | 206/701 |
| 5,296,738 | 3/1994 | Freyman et al. | 257/730 |
| 5,361,976 | 11/1994 | Blomfield | 206/509 |
| 5,371,408 | 12/1994 | Moulton et al. | 257/730 |
| 5,492,223 | 2/1996 | Boardman et al. | 206/563 |
| 5,574,314 | 11/1996 | Okada et al. | 257/730 |
| 5,590,787 | 1/1997 | Hodges | 206/701 |
| 5,594,204 | 1/1997 | Taylor et al. | 174/522 |

FOREIGN PATENT DOCUMENTS

| | | |
|---|---|---|
| 62-37950 | 2/1987 | Japan . |
| 63-293958 | 11/1988 | Japan . |
| 64-57738 | 3/1989 | Japan . |
| 5-267485 | 10/1993 | Japan . |

*Primary Examiner*—Deborah Jones
*Assistant Examiner*—Cathy F. Lam

[57] ABSTRACT

Substrates having a wide range of thickness, and intended to be overmolded with a plastic package body, are accommodated in a common mold. The top surface of the substrate is provided with a dam structure, which may be formed as an additional layer on the substrate, and which is preferably in the form of a square ring. A groove (channel) is machined (e.g., by routing) into the surface of the dam structure. The top mold half, having a cavity for forming the package body, is provided with a sealing structure at the periphery of the cavity. The sealing structure has a ridge fitting into the channel of the dam structure. The depth of the groove in the dam structure is readily adjusted to ensure uniform clamping pressure of the top mold half on the substrate, so that liquid molding compound is contained within the cavity and so that undue pressure is not exerted on the substrate.

4 Claims, 3 Drawing Sheets

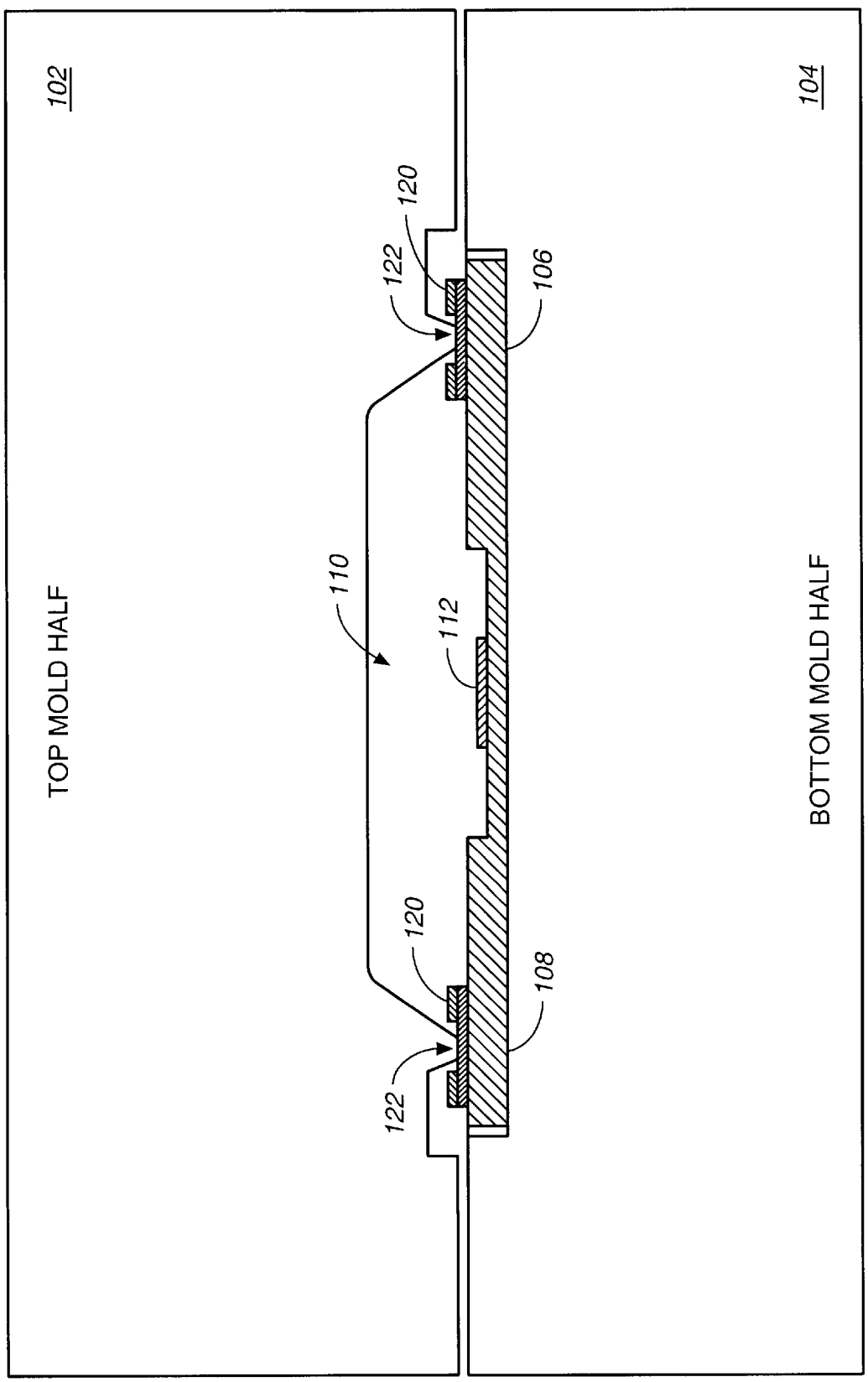
FIG._1

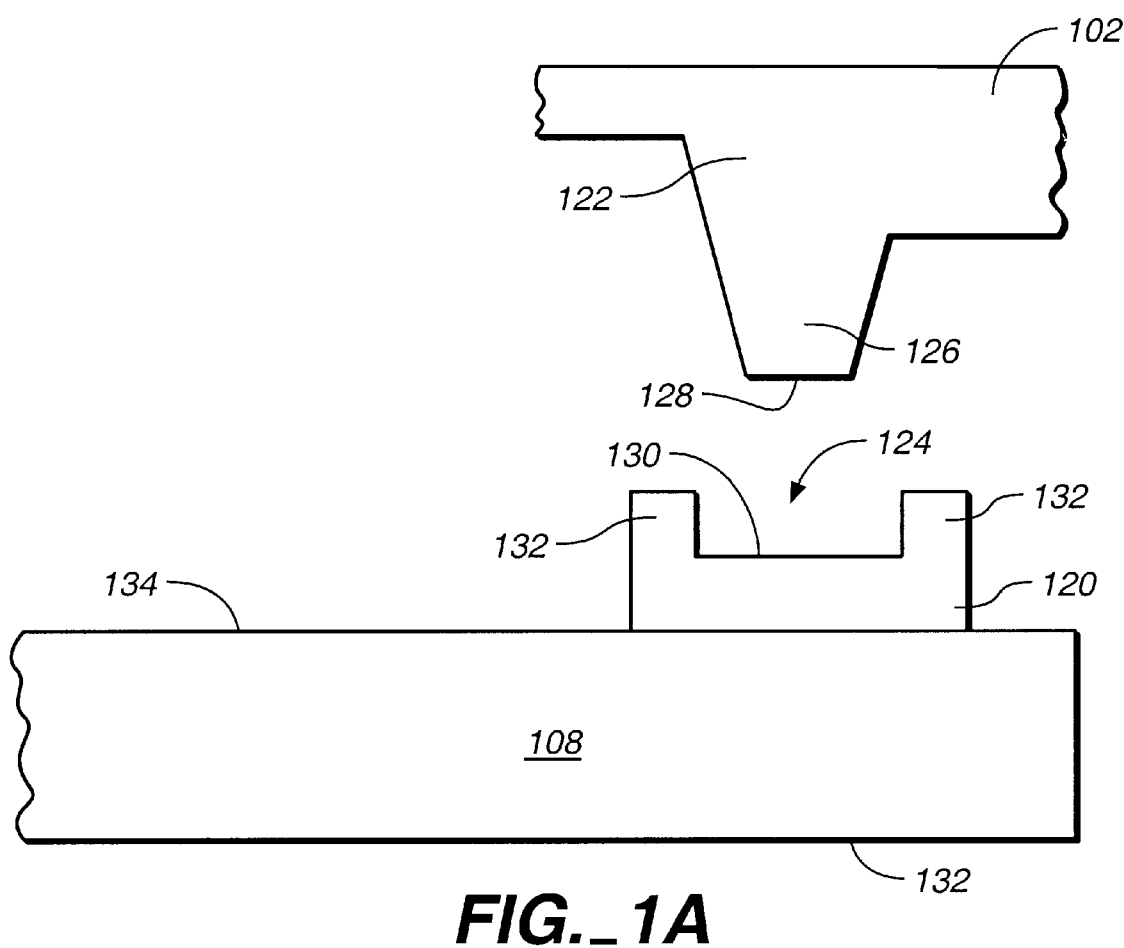
FIG._1A

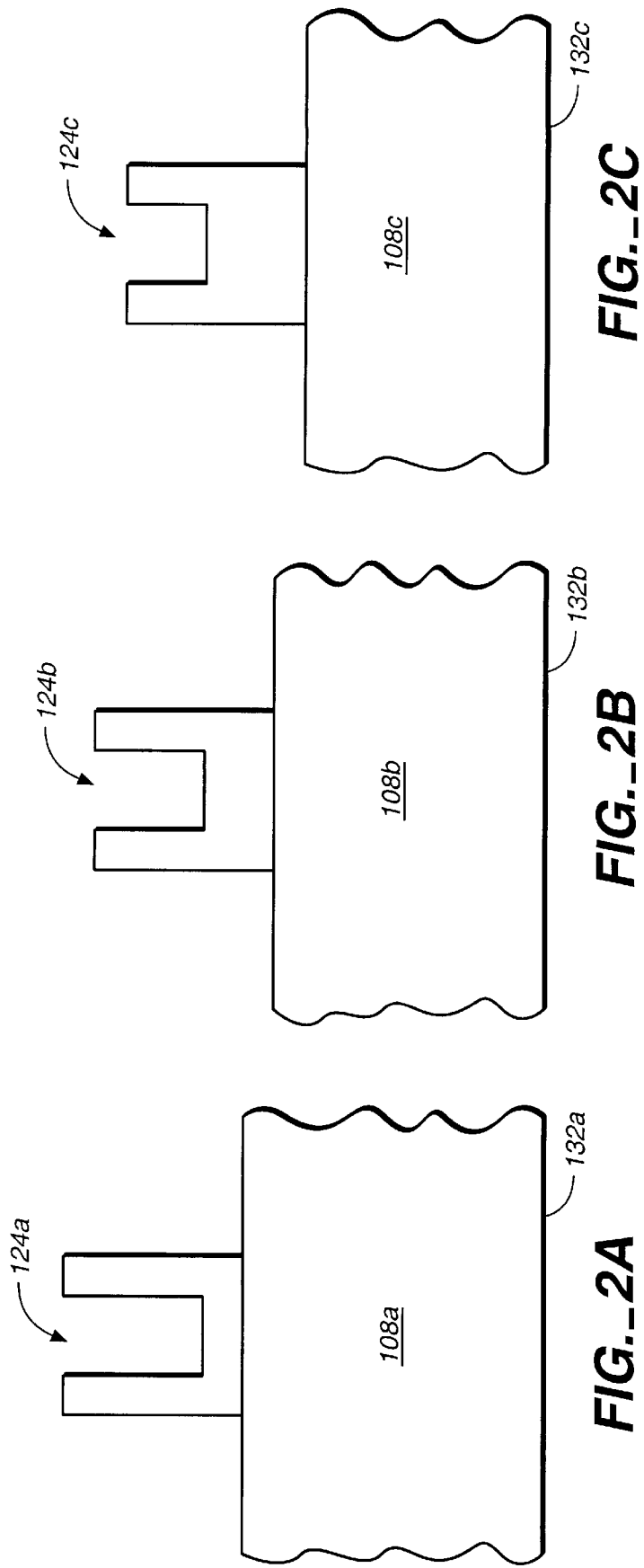

OVERMOLDED PACKAGE BODY ON A SUBSTRATE

This application is a divisional application of commonly-owned, U.S. Pat. application Ser. No. 08/506,164, filed Jul. 24, 1995, now U.S. Pat. No. 5,744,084.

TECHNICAL FIELD OF THE INVENTION

The invention relates to the packaging of integrated circuit (IC) semiconductor devices (chips), especially to techniques for covering a chip that is mounted to a printed circuit board (PCB) with a plastic molded body.

BACKGROUND OF THE INVENTION

Generally, semiconductor packages provide protection for an integrated circuit chip (semiconductor die, or device) from undesirable vagaries of the environment (e.g., dust, humidity, mechanical shock, and the like). Typically, the package has an external surface that is provided with external connections (pins, leads, ball bumps, and the like) for connecting the die to an external system (e.g., for mounting the packaged device to a board, into a socket, and the like). Within the package itself, the die is electrically connected to internal portions of the external connections, by wire bonding, bump bonding, or the like, in some cases via conductive traces within the package. Generally, the overall objective of package design is to provide these various features at the lowest possible manufacturing cost, for a given to application.

A type of packaging that has many favorable attributes is plastic molding over a die that has been mounted to a printed circuit board (PCB). This is sometimes referred to as a "PCB chip carrier package"). In this case, the plastic molding forms a package body, which is a portion of the overall packaging. The PCB forms another portion of the package, and may be provided with pins, ball bumps or the like, as discussed hereinabove. In certain instances, the PCB may be a multi-layer PCB, as is well known.

Commonly-owned U.S. Pat. No. 5,262,927, incorporated by reference herein, describes a technique involving plastic molding a package body on one side (surface) of a PCB, wherein the molded body is formed in a central area of the PCB, and does not extend to the edges (periphery) thereof. This is referred to in the patent as a "partially-molded PCB chip carrier". There are listed, on the summary page of that patent, a number of references cited, which are also incorporated by reference herein as being generally instructive.

The following patents, incorporated by reference herein, are also cited as being generally instructive of plastic molding techniques: U.S. Pat. No. 4,887,149; U.S. Pat. No. 5,136,366; U.S. Pat. No. 5,130,761; JP 52-53665; and JP 58-143557.

The present invention is particularly directed to molded PCB type packages (or chip carriers). Examples of such packages are Plastic Ball Grid Arrays (PBGAS), Plastic Pin Grid Arrays (PPGAs), and Plastic Chip Carriers (PCCs).

For a molded PCB package, the mold tool consists of two, mating, clamshell-type halves. The top mold half typically has a cavity that is used to form the molded body of the package. The bottom mold half typically has a shallow recess for receiving and locating the PCB substrate. The recess in the bottom mold half is nominally as deep as the thickness of the PCB.

With the substrate in the mold (and with a die mounted atop or within the substrate, collectively referred to as "to the substrate"), the two halves are closed around the substrate and the plastic mold material (molding compound) is transferred in liquid form (e.g., through runners and gates, as is well known) into the top mold cavity. With the molding compound in its liquid form, the mold must form a seal around the perimeter (periphery) of the mold cavity to prevent the liquid plastic from leaking out of the cavity. For a fully-overmolded package, the faces of the mold halves, outside of the area of the substrate are expected to contact one another (in a perimeter area of the mold), prior to injecting molding compound into the cavity. For a partially-overmolded package, the top mold half seals to the surface of the substrate being partially-overmolded.

For partially-overmolding a plastic body on a PCB substrate, it is necessary that the top mold half clamp onto the surface of the substrate, to prevent the liquid molding compound from leaking out of the cavity and onto the surface of the substrate outside of an area whereas it is desired to form the package body. To this end, the top mold is typically designed to compress the substrate by 2 mils, to ensure a good seal.

Typically, the mold is a precision machined tool that is designed for close tolerance based on a designated PCB substrate thickness. However, in the fabrication of the PCB substrate, the thickness of the substrate sometimes varies from batch-to-batch. This is especially evident in the case of multi-layer PCB substrates, and when the number of layers changes with specific designs. This makes it difficult, at best, to have a common mold tool that is usable (viable) for molding a plastic body on different thicknesses substrates. Generally, a different mold is required for each different thickness substrate. Further, for a given substrate, close thickness control is required, and is often difficult to achieve.

As mentioned above, a mold may be designed to compress a substrate by 2 mils, to ensure a good seal. When too little pressure is used (e.g., less than 2 mils of compression), the molding compound can leak out of the cavity onto the surface of the substrate causing, inter alia, poor filling of the cavity and flashing (excess molding compound on the surface of the substrate, outside of the area of the package body).

Typically, a single layer PCB substrate may vary in thickness (from substrate-to-substrate) up to 10% from its design (nominal) thickness. For example, a substrate designed to have a thickness of 62 mils (which is a common substrate thickness) can easily be expected to vary in thickness from 59 mils to 65 mils. In such a situation, the mold will be designed to close at 57 mils, to ensure that there is a 2 mils compression ("closing pressure") exerted on the substrate, for the thinnest expected substrate (59 mils). This, however, means that a 65 mil substrate will be compressed by the same mold by 8 mils, or four times as much as the thinner substrate was compressed. Hence, it is seen that for a range of substrate thicknesses, the closing pressure exerted by a common mold can vary widely. This (the pressure on the surface of the substrate, especially excess pressure) can result in deformation of the PCB material. The deformation can result in damage to the fine metal traces on the PCB surface (and, in the case of multi-layer PCBs, within the layers of the substrate).

With the expected variation in thickness of substrates, especially multi-layer substrates, the clamping pressure evidently varies in a rather uncontrollable manner. This makes it virtually impossible to mold packages from different substrate manufacturing batches which exhibit variations in thickness. Also, changes in substrate designs, layers, and hence thickness, will require modifications in the mold tool. In the least, it is undesirable that any process be so poorly controlled, especially so late in the overall process of fabricating and packaging a semiconductor device.

DISCLOSURE OF THE INVENTION

It is therefore an object of the present invention to provide an improved technique for packaging a die, especially for molding a plastic body over a PCB substrate (or chip carrier).

It is a further object of the present invention to provide a technique whereby a common mold can be used for different thickness substrates, especially different thickness PCB substrates.

It is a further object of the present invention to provide a technique for controlling the clamping pressure of a mold on a surface of a substrate.

For purposes of this discussion, by way of definition only, it is the "top" mold half that contains the cavity for molding the package body onto the corresponding "top" surface of a substrate.

According to the invention, a dam structure is disposed on the top surface of a substrate, and a top mold half is provided with a corresponding sealing structure that mates with the dam structure. An area where the dam structure is disposed on the top surface of the substrate is termed the "clamping area".

According to an aspect of the invention, the dam structure has a groove (channel), and the sealing structure has a ridge. The groove mates with the ridge to ensure that molding compound does not leak out of the top mold cavity. It is intended that the bottom surface of the ridge contact the bottom surface of the groove, unimpaired. An area where the bottom of the ridge contacts the bottom of the groove is termed the "clamping location" and is within the "clamping area". The clamping area, being disposed as it is at the periphery of the cavity, essentially defines the ultimate outline (footprint) of the package body.

According to an aspect of the invention, the dam structure can be provided on the top surface of the substrate as an additional layer, preferably as a ring (e.g. a square ring), formed of the same (e.g., PCB) material as the substrate (FR4, BT resin, teflon, and the like). The dam structure can alternatively be formed of a different material than the substrate (such as from a different PCB material).

In use, the dam structure is added, as a matter of course, to all substrates intended to receive a molded plastic body from a common mold.

Generally, according to the present invention, substrates of varying thicknesses, and intended to be molded in the same mold apparatus, are all provided with a similar dam structure, and the depth of the groove in the dam structure is controlled to establish a uniform distance ("virtual thickness") between the bottom of the groove and the bottom of the substrate.

In an alternate embodiment of the invention, the top mold can be designed to have springs that allow for some "float" at the clamping area. However, this is not preferred since is makes for a much more complicated and expensive mold that will require more maintenance during operation.

Advantages of the invention include:
improving the quality (e.g., yield) of PCB packages;
allowing for variation in substrate thickness, and thus lower cost; and
allowing for changes in package design, including changes in substrate layers.

Other objects, features and advantages of the invention will become apparent in light of the following description thereof.

BRIEF DESCRIPTION OF THE DRAWINGS

Throughout the figures, like numerals are intended to represent like elements.

FIG. 1 is a cross-sectional view of a technique of molding a PCB package, according to the present invention.

FIG. 1A is a cross-sectional view of a substrate having a dam structure, and a top mold half having a corresponding sealing structure, generally showing a "magnified" portion of FIG. 1, according to the present invention.

FIG. 2A is a cross-sectional view of a relatively thick printed circuit board substrate with a dam structure on its top surface, according to the present invention.

FIG. 2B is a cross-sectional view of a printed circuit board substrate of medium thickness, with a dam structure on its top surface, according to the present invention.

FIG. 2C is a cross-sectional view of a relatively think printed circuit board substrate with a dam structure on its top surface, according to the present invention.

DETAILED DESCRIPTION OF THE INVENTION

FIG. 1 shows a mold having a top mold half 102 and a bottom mold half 104.

The bottom mold half 104 is provided with a recess 106 for receiving a substrate 108 (shown cross-hatched in this figure) upon which it is intended to mold a plastic body. Generally, the recess 106 is sufficiently long, wide and deep so that the substrate 108 will be fully received by the recess, with the top (as viewed) surface of the substrate nominally aligned (coplanar) with the top (as viewed) surface of the bottom mold half 104.

The top mold half 102 is provided with a cavity 110 which will form a package body on the top surface of the substrate 108. Runners, gates and the like, for injecting molding compound into the cavity are well known, and are omitted from the figure for illustrative clarity. Generally, the cavity 110 is aligned with a central area of the recess 106, hence also aligned with a central area of the substrate 108, although it may be offset from this nominal alignment.

An integrated circuit die 112 (shown cross-hatched) is mounted to the top surface, or within an opening (as shown) extending into the top surface of the substrate 108, and may be connected to wiring traces (well known, not shown) on the top surface or on intermediated layers of the substrate by bond wires, or the like. It is not particularly germane to this invention how the die is mounted to the substrate. Rather, it is simply assumed that a die is mounted in a suitable (any desired) manner "to" the substrate and that it is desired to form a molded plastic body over the die and a central region (portion) of the substrate.

A dam structure 120 is provided on the top surface of the substrate 108. As shown, the dam structure 120 extends upward (as viewed) from the top surface of the substrate as a ring (e.g., as a square ring—square package bodies being typical) around a "clamping area" of the substrate 108. The clamping area is within the periphery of the substrate, and without the area where the die is mounted to the substrate. The dam structure 120 extends above the top surface of the substrate 108, and may simply be formed as an additional layer (or layers) of the substrate, of the same material as the layer(s) of the substrate, or of a different material.

The dam structure 120 can be provided on the top surface of the substrate as an additional layer, preferably as a ring (e.g. a square ring), formed of the same material as the substrate (FR4, BT resin, teflon and the like).

In the practice of this invention, the dam structure is added, as a matter of course, to all substrates intended to receive a molded plastic body by a common (i.e., the same) mold.

The top mold half 102 is provided with a sealing structure 122 at the periphery of the cavity and, ultimately, that is aligned with the dam structure 120. Hence, the sealing structure 122 also extends as a ring (e.g., as a square ring—square package bodies being typical) around a clamping area of the to-be-molded substrate 108.

As best viewed in FIG. 1A, the dam structure 120 has a height (extending from the surface of the substrate) and a width (extending across the surface of the substrate), and is provided with a groove (channel) 124 extending a depth from the top surface of the dam structure towards the top surface of the substrate. Evidently, the depth of the groove is less than the overall height of the dam structure. As will be evident, the height of the dam structure is generally uniform, from substrate-to-substrate (e.g., from PCB-to-PCB), and the depth of the groove is determined on a case-by-case basis, depending on the actual thickness of the substrate. The groove may be a square notch (channel), or it may have chamfered edges, as illustrated.

As best viewed in FIG. 1A, the sealing structure 122 includes a ridge 126. The ridge is generally sized and shaped to fit within the groove in the dam structure, mating therewith to ensure that molding compound injected into the cavity (110) does not leak out of the top mold cavity when the mold is assembled for forming a plastic package body on the top surface of the substrate.

It is specifically intended (i.e., preferred) that the bottom surface 128 of the ridge 126 contact the bottom surface 130 of the groove 124. To this end, the width of the groove 124 should be greater than the width of the ridge 126. (Both of these widths would be measured horizontally across the page, from left-to-right, as drawn.) To this end, it is also important that the height of the "ears" 131 (that portion of the dam structure which extends above the bottom of and define the groove) be less than the height of the ridge 126. (Both of these heights would be measured vertically across the page, from top-to-bottom, as drawn. Evidently, the height of the ears 131 is equivalent to the depth of the groove 124.) A critical dimension Is the distance between the bottom 130 of the groove 124 and the bottom surface 132 of the substrate, which is termed the "virtual thickness" of the substrate.

Evidently, the virtual thickness of the substrate is greater than its actual thickness (measured from the bottom surface 132 of the substrate 108 to the top surface 134 of the substrate 108).

The use of a dam structure on the substrate, and a corresponding sealing structure on the top mold half allow substrates of varying thicknesses to be molded with a common (i.e, the same) mold tool.

Generally, it is presumed that the ultimate thickness of the molded package body is not of paramount concern, so long as the package body covers the die with at least a sufficient amount of molding compound. In other words, it is not disadvantageous that the completed molded body be slightly thicker than intended. Given this, a mold can be designed to accommodate substrates having a wide range of thicknesses, by employing the techniques of the present invention.

Turning to FIGS. 2A, 2B and 2C, consider the cases of molding three different-thickness substrates 108a (thick), 108b (medium) and 108c (thin), using a common mold (e.g., the mold halves 102 and 104) having a given sealing structure such as the sealing structure 122 of FIG. 1A (with ridge 126). Each of the substrates 108a, 108b and 108c is provided with a dam structure, such as the dam structure 120 of FIG. 1A.

As shown in FIG. 2A, a thick substrate 108a has a dam structure 120 is formed atop the substrate, and the groove 124a in the dam structure is relatively deep.

As shown in FIG. 2B, a medium thickness substrate 108b has a dam structure 120 is formed atop the substrate, and the groove 124b in the dam structure is of medium depth.

As shown in FIG. 2C, a thin substrate 108c has a dam structure 120 is formed atop the substrate, and the groove 124c in the dam structure is relatively shallow.

The dam structures 120 of FIGS. 2A, 2B and 2C are all of uniform extent (height) above the surface of the respective substrates 108a, 108b and 108c. Hence, they can be applied as a uniform structure to dissimilar substrates having a wide range of thicknesses.

FIGS. 2A, 2B and 2C have been drawn with the bottom surfaces 132a, 132b and 132c of the respective substrates 108a, 108b and 108c aligned, and to scale insofar as the bottoms of the grooves 124a,b,c are all at the same distance from the bottom surfaces of the substrates. Other dimensions of the substrates are not to scale. However, it is evident in a side-by-side comparison of the figures that the substrate 108a is thicker than the substrate 108b which, in turn, is thicker than the substrate 108c. Since the bottoms of the grooves are all at the same distance from the bottom surfaces of the substrates, this illustrates how the "virtual" thicknesses of the three substrates can be maintained uniform irrespective of variations in the actual thicknesses of the substrates.

In the three cases exemplified by FIGS. 2A, 2B and 2C, the level at which the top mold half (namely, the sealing structure, or ridge 126) will clamp to the dam structure is the same, for all three cases. The level at which the seal is provided is the same in all cases, and the virtual thicknesses of the different-thickness substrates (108a, 108b, 108c) is caused to be uniform, irrespective of variations in their actual thicknesses. Only the depth of the groove in the dam structure on the substrate has varied (from substrate-to-substrate), and this depth is readily (easily) controlled in the process of forming (e.g., machining) the groove.

Forming, and controlling (or adjusting), the depth of the groove in the dam structure is a relatively straightforward matter. Prior to molding, the substrate can be mounted in a routing machine, and the groove can be routed to a specified height above the bottom of the substrate to establish a predetermined virtual thickness for the substrate. The depth of the groove (channel) is easily controlled such that the thickness of the remaining substrate at that location (i.e., the distance between the bottom of the groove and the bottom of the substrate) is maintained to a close tolerance, which corresponds to a closing pressure of 2 mils (when the substrate is in the mold). Given such control over the "virtual" thickness of the substrate in the clamping area, the mold cavity can readily be designed to precisely clamp the substrate with the required pressure (e.g., 2 mils of clamping pressure) to ensure good cavity-filling characteristics, minimum flashing, and without exhibiting excessive pressure on the surface of the substrate. Variations in the manufactured thickness of the substrate, including multi-layer substrates, and changes in the design and layer thickness can be accommodated by adjusting the depth of the groove in the dam structure, to result in the same virtual thickness and clamping pressure at the clamping location.

Hence, it can be seen that substrates having a wide range of thicknesses can be accommodated by a single (common) mold simply by the addition of a dam structure atop the substrate, and controlling the level (above the bottom of the substrate) of the bottom of the groove.

The invention results in a mold and package design that resolves the problems resulting from variations in the thickness of the substrate. This results in a more reliable package, and also reduces the cost of manufacturing for this type of package, since a particular mold can be designed for multiple types of packages having different thicknesses and layers. The ability to tolerate variations in the thickness of the substrate will also result in lowering the cost of the raw materials used in the manufacturing of the substrate. The reliability of the package is enhanced, as the substrate is not excessively compressed during the molding process.

The above, and other objects, features, advantages and embodiments of the invention, including other (i.e., additional) embodiments of the techniques discussed above may become apparent to one having ordinary skill in the art to which this invention most nearly pertains, and such other and additional embodiments are deemed to be within the spirit and scope of the present invention. For example, in an alternate embodiment of the invention, the top mold can be designed to have springs that allow for some "float" at the clamping area. However, this is not preferred since is makes for a much more complicated and expensive mold that would require more maintenance during operation.

What is claimed is:

1. A chip carrier package, comprising:
   a substrate having a top surface and a bottom surface;
   a semiconductor die, the semiconductor die mounted to the top surface of the substrate;
   a dam, the dam disposed on the top surface of the substrate, the dam surrounding the semiconductor die, the dam defining a groove and a groove bottom adapted for interfacing with an upper mold portion; and
   a molded plastic body covering the semiconductor die and at least partially covering the top surface of the substrate, the molded plastic body having a top surface; wherein
   the groove bottom and the substrate bottom define a specific dimensional distance such that the height from at least a portion of the bottom surface of the substrate to at least a portion of the top surface of the molded plastic body is independent of the thickness of the substrate.

2. The chip carrier package of claim 1, wherein:
   the substrate is a printed circuit board.

3. The chip carrier package of claim 2, wherein:
   the printed circuit board is a multi-layer printed circuit board.

4. The chip carrier package of claim 3, wherein:
   the dam is a layer of the multi-layer printed circuit board.

* * * * *